(12) United States Patent
Nakashiba

(10) Patent No.: US 11,183,471 B2
(45) Date of Patent: Nov. 23, 2021

(54) SEMICONDUCTOR DEVICE

(71) Applicant: RENESAS ELECTRONICS CORPORATION, Tokyo (JP)

(72) Inventor: Yasutaka Nakashiba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 21 days.

(21) Appl. No.: 16/681,329

(22) Filed: Nov. 12, 2019

(65) Prior Publication Data

US 2021/0143112 A1 May 13, 2021

(51) Int. Cl.
*H01L 23/64* (2006.01)
*H01L 23/00* (2006.01)
*H01L 23/66* (2006.01)

(52) U.S. Cl.
CPC .......... *H01L 23/645* (2013.01); *H01L 23/642* (2013.01); *H01L 24/45* (2013.01); *H01L 23/66* (2013.01); *H01L 2924/1205* (2013.01); *H01L 2924/1206* (2013.01); *H01L 2924/1304* (2013.01)

(58) Field of Classification Search
CPC ..... H01L 2924/1205; H01L 2924/1206; H01L 24/45; H01L 2924/1304; H01L 23/645; H01L 23/66; H01L 23/642; H01L 28/10
See application file for complete search history.

(56) References Cited

U.S. PATENT DOCUMENTS 6,002,161 A * 12/1999 Yamazaki ............. H01L 23/645
257/531
10,895,683 B1 * 1/2021 Kuwajima ............... G02B 6/13

FOREIGN PATENT DOCUMENTS

JP 2005-072233 A 3/2005

* cited by examiner

*Primary Examiner* — Jasmine J Clark
(74) *Attorney, Agent, or Firm* — McDermott Will & Emery LLP

(57) ABSTRACT

A semiconductor device includes a semiconductor substrate, a multilayer wiring layer, a first inductor element, and a first capacitor element. The multilayer wiring layer is formed on the semiconductor substrate. The first inductor element and the first capacitor element are formed in the multilayer wiring layer. The first capacitor element is formed in the same layer as a layer in which the first inductor element is formed. The first capacitor element is formed inside the first inductor element in plan view.

16 Claims, 25 Drawing Sheets

SEMICONDUCTOR DEVICE

It relates to a semiconductor device, for example a semiconductor device including an inductor element and a capacitor element.

A semiconductor device including an inductor element and a capacitor element is known as a passive element. In the semiconductor device disclosed in Japanese Unexamined Patent Application Publication No. 2005-072233, the inductor element and the capacitor element are formed of wiring (conductive film) in multilayer wiring layer. The inductor element overlaps with the capacitor element in plan view. This makes it possible to reduce a size of the semiconductor device as compared with the case where the inductor element does not overlap with the capacitor element in plan view.

SUMMARY

However, in the semiconductor device described in Japanese Unexamined Patent Application Publication No. 2005-072233, the inductor element and the capacitor element are formed in layers that differ from each other in the multilayer wiring layer. As a result, the wiring resources may become inadequate in a region in which the inductor element and the capacitor element are formed in the multilayer wiring layer compared to other regions. Thus, for example, a wiring electrically connected to a transistor may be formed to bypass the region. As a result, the semiconductor device is large. Thus, a conventional semiconductor device can be improved from a viewpoint of miniaturization of the semiconductor device.

A problem of embodiments is to downsize the semiconductor device. Other problems and novel features will become apparent from the description of the specification and drawings.

The semiconductor device according to embodiments includes: a semiconductor substrate; a first inductor element; and a first capacitor element formed in the same layer as a layer in which the first inductor element is formed. The first capacitor element is formed inside the first inductor element in plan view.

According to embodiments, the semiconductor device can be miniaturized.

DETAILED DESCRIPTION

Figure 1:
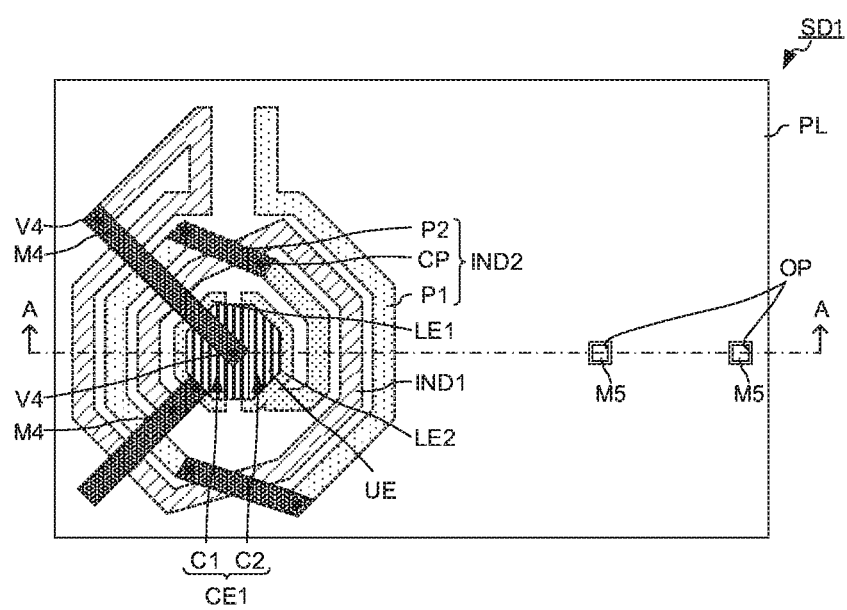
FIG. 1 is a plan view illustrating an exemplary configuration of a main portion of a semiconductor device according to a first embodiment.

Hereinafter, a semiconductor device according to embodiments will be described in detail by referring to the drawings. In the specification and drawings, the same or corresponding components are denoted by the same reference numerals or hatching, and a repetitive description thereof is omitted. In the drawings, for convenience of description, the configuration may be omitted or simplified.

First Embodiment

The semiconductor device according to first embodiment includes a bandpass filter.

(Configuration of Semiconductor Device)

Figure 2:
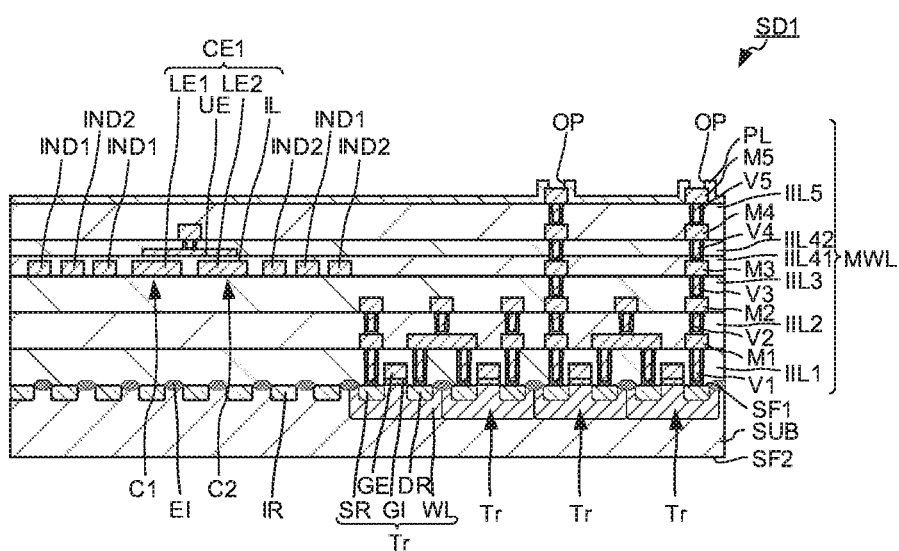
FIG. 2 is a cross-sectional view illustrating an exemplary configuration of the main portion of the semiconductor device according to the first embodiment.

FIG. 1 is a plan view illustrating an exemplary configuration of a main portion of a semiconductor device SD1 according to the first embodiment. FIG. 2 is a cross-sectional view illustrating the exemplary configuration of the main portion of the semiconductor device SD1. FIG. 2 is a cross-sectional view taken along line A-A of FIG. 1.

The semiconductor device SD1 includes a semiconductor substrate SUB, a multilayer wiring layer MWL, a first inductor element IND1, a second inductor element IND2, and a capacitor element CE1.

The semiconductor substrate SUB includes a first surface (upper surface) SF1 and a second surface (lower surface) SF2 which are in front and back relation to each other. The first surface SF1 and the second surface SF2 are located on opposite sides of the semiconductor substrate SUB. The first surface SF1 of the semiconductor substrate SB is a main surface on which a semiconductor element (transistor Tr) is formed. Examples of type of semiconductor substrate SUB include silicone substrate.

The semiconductor element constitutes an electronic circuit. For example, an example of the semiconductor element includes an active element such as a transistor and a passive element such as a resistive element. In the first embodiment, the semiconductor device is a transistor Tr.

well region WL, source region SR, drain region DR, impurity region IR, and element isolation EI are formed in the semiconductor substrate SUB. Gate insulating film GI and gate electrodes GE are formed on the first surface SF1 of the semiconductor substrate SUB. In first embodiment, the transistor Tr is formed on the first surface SF1 of the semiconductor substrate SUB. The transistor Tr includes the well region WL, the source region SR, the drain region DR, the gate insulating film GI, and the gate electrode GE.

The well region WLs is formed on the first surface SF1 side of the semiconductor substrate SUB. The well region WL may contain a p-type impurity or an n-type impurity. The type of the impurity included in the well region WL is appropriately determined in accordance with the conductivity type of the transistor Tr.

The source region SR is formed on the first surface SF1 of the semiconductor substrate SUB in the well region WL of the semiconductor substrate SUB. The source region SR contacts with the well region WL. The source region SR may contain a p-type impurity or an n-type impurity. The type of the impurity included in the source region SR is appropriately adjusted according to the conductivity type of the transistor.

The drain region DR is formed on the first surface SF1 of the semiconductor substrate SUB in the well region WL of the semiconductor substrate SUB. The drain region DR contacts with the well region WL. The drain region DR may contain a p-type impurity or an n-type impurity. The type of the impurity included in the drain region DR is appropriately adjusted according to the conductivity type of the transistor.

The gate insulating film GI is formed on the first surface SF1 of the semiconductor substrate SUB. In plan view, on both sides of the gate insulating film GI, the source region SR and the drain region DR are formed such that the source region SR and the drain region DR is adjacent to the gate insulating film GI, respectively. The material of the gate insulating film GI is, for example, silicon oxide (SiO2).

The gate electrode GE is formed on the gate insulating film GI. The material of the gate electrode GE is, for example, conductive polycrystalline silicon or aluminum.

The impurity region IRs is formed on the first surface SF1 side of the semiconductor substrate SUB. The impurity region IR is formed outside the well region WL in the semiconductor substrate SUB without contacting with the well region WL. The impurity region IR is a semiconductor layer. The impurity region IR may contain a p-type impurity or an n-type impurity.

The element isolation EI is an insulating film formed on the first surface SF1 of the semiconductor substrate SUB. The element isolation EI electrically isolates the plurality of transistors Tr formed on the first surface SF1 of the semiconductor substrate SUB from each other. The element isolation EI electrically insulates two regions adjacent to each other among the source region SR, the drain region DR, and the impurity region IR. The material of the element isolation EI is, for example, silicon oxide.

The semiconductor device SD1 may not have the impurity region IR and the element isolation EI. The element isolation EI may be one LOCOS film formed such that the LOCOS film overlaps with all of the first inductor element IND1, the second inductor element IND2, and the capacitor element CE1 in plan view. The element isolation EI may be an insulating film buried in a recess formed in the semiconductor substrate SUB.

The multilayer wiring layer MWL is formed on the semiconductor substrate SUB such that the multilayer wiring layer MWL covers the transistor Tr. The multilayer wiring layer MWL is composed of two or more wiring layers. The wiring layer is a layer including an interlayer insulating layer and one or both of a wiring and a via that are formed in the interlayer insulating layer. The via is a conductive member that electrically connects two wiring formed in layers that differ from each other. For example, "wiring" is a conductive film configured to transmit an electrical signal.

The multilayer wiring layer MWL includes a first interlayer insulating layer IIL1, a first via V1, a first wiring M1, a second interlayer insulating layer IIL2, a second via V2, a second wiring M2, a third interlayer insulating layer IIL3, a third via V3, a third wiring M3, a fourth interlayer insulating layer IIL41, a fourth interlayer insulating layer IIL42, a fourth via V4, a fourth multilayer wiring layer M4, a fifth interlayer insulating layer IIL5, a fifth via V5, a fifth wiring M5, and a protective layer PL.

The multilayer wiring layer MWL is formed on semiconductor substrate SUB. The first inductor element IND1, the second inductor element IND2, and the capacitor element CE1 are formed in the multilayer wiring layer MWL. Details of each element will be described later.

The first interlayer insulating layer IIL1 is formed on the semiconductor substrate SUB such that the first interlayer insulating layer IIL1 covers the transistor Tr. Examples of material for the first interlayer insulating layer IIL1 include silicon oxide. A thickness of the first interlayer insulating layer IIL1 is not particularly limited.

The first via V1 is formed in the first interlayer insulating layer IIL1 such that the first via V1 reaches the source region SR or the drain region DR. As the configuration of the first via V1, a known configuration adopted as a via in the semiconductor technology can be adopted. The first via V1 includes, for example, a barrier film and a conductive film formed on the barrier film. Examples of material of the barrier film include titanium (Ti) and titanium nitride (TiN). The material of the conductive film is, for example, tungsten (W), aluminum (Al), or copper (Cu).

The first wiring M1 is formed on the first interlayer insulating layer IIL1. The first wiring M1 is electrically connected to the source region SR or the drain region DR through the first via V1. For the first wiring M1, a well-known structure employed as a wiring in the semiconductor technology can be employed. An example of the first wiring M1 is, for example, a stacked film in which a barrier film, a conductive film, and a barrier film are stacked in this order. Examples of material of the barrier film include titanium (Ti) and titanium nitride (TiN). Examples of the material of the conductive film include aluminum, copper and tungsten. In first embodiment, the first wiring M1 is aluminum wiring.

The second interlayer insulating layer IIL2 is formed on the first interlayer insulating layer IIL1 such that the second interlayer insulating layer IIL2 covers the first wiring M1. Examples of the material and the thickness of the second interlayer insulating layer IIL2 are similar to the examples of the material and the thickness of the first interlayer insulating layer IIL1.

The second via V2 electrically connects the first wiring M1 and the second wiring M2 to each other in the second interlayer insulating layer IIL2. An example of configuration of the second via V2 is similar to the configuration of the first via V1.

The second wiring M2 is formed on the second interlayer insulating layer IIL2. The second wiring M2 is electrically connected to the first wiring M1 through the second via V2. An example of the configuration of the second wiring M2 is similar to the example of the configuration of the first wiring M1.

The third interlayer insulating layer IIL3 is formed on the second interlayer insulating layer IIL2 such that the third interlayer insulating layer IIL3 covers the second wiring M2. Examples of the material and the thickness of the third interlayer insulating layer IIL3 are similar to the examples of the material and the thickness of the first interlayer insulating layer IIL1.

The third via V3 electrically connects the second wiring M2 and the third wiring M3 to each other in the third interlayer insulating layer IIL3. An example of configuration of the third via V3 is similar to the configuration of the first via V1.

The third wiring M3 is formed on the third interlayer insulating layer IIL3. The third wiring M3 is electrically connected to the second wiring M2 through the third via V3. An example of the configuration of the third wiring M3 is similar to the example of the configuration of the first wiring M1.

The fourth interlayer insulating layer IIL41 is formed on the third interlayer insulating layer IIL3 such that the fourth interlayer insulating layer IIL41 covers the third wiring M3, the first inductor IND1, the second inductor IND2, and a part of the capacitor CE1 (the first lower electrode LE1 and the second lower electrode LE2). The fourth interlayer insulating layer IIL41 directly contacts a side surface and an upper surface of the first inductor IND1, a side surface and an upper surface of the second inductor IND2, a side surface and an upper surface of the first lower electrode LE1, and a side surface and an upper surface of the second lower electrode LE2. An example of the material of the fourth interlayer insulating layer IIL41 is similar to the example of the material of the first interlayer insulating layer IIL1.

The upper surface of the fourth interlayer insulating layer IIL41 is a planarized CMP-polished surface. That is, the upper surface of the fourth interlayer insulating layer IIL41 is formed such that the upper surface be is substantially parallel to the first surface SF1 of the semiconductor substrate SUB. As a result, the capacitance of the capacitor element CE1 can be adjusted. A thickness of a portion of the fourth interlayer insulating layer IIL41 located on the first inductor element IND1, the second inductor element IND2, the first lower electrode LE1, and the second lower electrode LE2 is smaller than the thickness of other portions. A thickness and materials of the fourth interlayer insulating layer IIL41 are appropriately adjusted in accordance with desired capacitance values of the capacitor element CE1. For example, the thickness of the fourth interlayer insulating layer IIL41 is smaller than a thickness of the first interlayer insulating layer IIL1, a thickness of the second interlayer insulating layer IIL2, and a thickness of the third interlayer insulating layer IIL3. An example of the material of the fourth interlayer insulating layer IIL41 is similar to the example of the material of the first interlayer insulating layer IIL1. The thickness of the portion of the fourth interlayer insulating layer IIL41 located on the first inductor element IND1, the second inductor element IND2, the first lower electrode LE1, and the second lower electrode LE2 is, for example, about 500 nm.

The fourth interlayer insulating layer IIL42 is formed on the fourth interlayer insulating layer IIL41 such that the fourth interlayer insulating layer IIL42 covers a portion of the capacitor element CE1. An example of the material of the fourth interlayer insulating layer IIL42 is similar to the example of the material of the first interlayer insulating layer IIL1.

The fourth via V4 electrically connects the third wiring M3 and the fourth wiring M4 to each other in the fourth interlayer insulating layer IIL4, and electrically connects the upper electrode UE and the fourth wiring M4 of the capacitor element CE1 to each other. More specifically, the fourth via V4 formed between the third wiring M3 and the fourth wiring M4 is formed such that the fourth via V4 penetrates the fourth interlayer insulating layer IIL41 and the fourth interlayer insulating layer IIL42. The fourth via V4 formed between the upper electrode UE of the capacitor element CE1 and the fourth wiring M4 is formed such that the fourth via V4 penetrates the fourth interlayer insulating layer IIL42. That is, the fourth via V4 formed between the upper electrode UE of the capacitor element CE1 and the fourth wiring M4 does not penetrate the fourth interlayer insulating layer IIL42. An example of configuration of the fourth via V4 is similar to the configuration of the first via V1.

The fourth wiring M4 is formed on the fourth interlayer insulating layer IIL4. The fourth wiring M4 is electrically connected with the third wiring M3 through the fourth via V4. An example of the configuration of the fourth wiring M4 is similar to the example of the configuration of the first wiring M1.

The fifth interlayer insulating layer IIL5 is formed on the fourth interlayer insulating layer IIL4 such that the fifth interlayer insulating layer IIL5 covers the fourth wiring M4. Examples of the material and the thickness of the fifth interlayer insulating layer IIL5 are similar to the examples of the material and the thickness of the first interlayer insulating layer IIL1.

The fifth via V5 electrically connects the fourth wiring M4 and the fifth wiring M5 to each other in the fifth interlayer insulating layer IIL5. An example of the configuration of the fifth via V5 is similar to the example of the configuration of the first via V1.

The fifth wiring M5 is formed on the fifth interlayer insulating layer IIL5. The fifth wiring M5 is electrically connected with the fourth wiring M4 through the fifth via V5. An example of the configuration of the fifth wiring M5 is similar to the example of the configuration of the first wiring M1.

The protective layer PL is a layer for protecting the semiconductor device SD1 from external moisture and the like. The protective layer PL is formed on the fifth interlayer insulating layer IIL5. In the protective layer PL, an opening OP exposing a portion of the fifth wiring M5 is formed in the protective layer PL. The protective layer PL directly contacts with a side surface of the fifth wiring M5 and with a portion of an upper surface of the fifth wiring M5.

The opening OP is preferably formed at a position different from the first inductor element IND1, the second inductor element IND2, and the capacitor element CE1 in plan view. As a result, damage to the first inductor element IND1, the second inductor element IND2, and the capacitor element CE1 due to the shock when an external wiring is connected can be suppressed.

The protective layer PL may be a single layer film or a stacked film of two or more layers. Examples of the protective layer PL include a silicon oxide film, a silicon oxynitride film, a silicon nitride film, a Phospho Silicate Glass (PSG) film, and a stacked film of these films. A thickness of the protective layer PL is, for example, 0.3 μm or more and 0.7 μm or less.

The first inductor element IND1 is formed in the multilayer wiring layer MWL such that the first inductor element IND1 surrounds the capacitor element CE1 in plan view. In the first embodiment, the first inductor device IND1 is formed by the third wiring M3 on the third multilayer wiring layer IIL3. The first inductor element IND1 is electrically connected to the second inductor element IND2 and the capacitor element CE1 such that the first inductor element IND1 constitutes, for example, a part of the band-pass filter.

The shape of the first inductor element IND1 is not particularly limited as long as the first inductor element IND1 can function as an inductor element. The shape of the first inductor device IND1 in plan view is, for example, a spiral shape or a substantially annular shape. The shape of the first inductor device IND1 in plan view may be a clockwise spiral shape or a counterclockwise spiral shape. In first embodiment, the planar shape of the first inductor device IND1 is a counterclockwise spiral shape.

The width and the thickness of the first inductor element IND1 are not particularly limited as long as the first inductor element IND1 can function as an inductor element. The width of the first inductor elements IND1 may be about the same as or different from the width of the third wiring M3 formed in the same layers. The thickness of the first inductor elements IND1 is about the same as the thickness of the third wiring M3 formed in the same layer.

The region surrounded by the first inductor element IND1 may or may not overlap with the wiring electrically connected with the transistor Tr in plan view. The region surrounded by the first inductor element IND1 preferable overlaps the wiring electrically connected with the transistor Tr in plan view. As a result, it is possible to suppress the increase in size of the semiconductor device SD1 by forming the detour wiring, and as a result, the semiconductor device SD1 is reduced in size.

The second inductor element IND2 is formed in the multilayer wiring layer MWL such that the second inductor element IND2 surrounds the capacitor element CE1 in plan view. The second inductor element IND2 may be formed in the same layer as the first inductor element IND1, or may be formed in a layer different from the first inductor element IND1. In the first embodiment, the second inductor element IND2 is formed in the same layer as the first inductor element IND1. The second inductor device IND2 is formed of a third wiring M3 on the third multilayer wiring layer IIL3.

The shape of the second inductor element IND2 is not particularly limited as long as the second inductor element IND2 can function as an inductor element. The shape of the second inductor device IND2 in plan view is, for example, a spiral shape or a substantially annular shape. The shape of the second inductor device IND2 in plan view may be a clockwise spiral shape or a counterclockwise spiral shape. In the first embodiment, the planar shape of the second inductor device IND2 is a clockwise spiral shape.

The shape of the second inductor element IND2 may be the same as or different from the shape of the first inductor element IND1. For example, the winding direction of the second inductor element IND2 may be the same as or different from the winding direction of the first inductor element IND1. In first embodiment, the winding direction of the first inductor element IND1 is counterclockwise, and the winding direction of the second inductor element IND2 is clockwise. Here, in the present specification, the "winding direction" is a direction in which the inductor element extends from the outside toward the inside.

The area surrounded by the second inductor element IND2 may or may not overlap with the wiring electrically connected with the transistor Tr in plan view. The area surrounded by the second inductor element IND2 preferable overlaps with the wiring electrically connected with the transistor Tr in plan view. As a result, it is possible to suppress the increase in size of the semiconductor device SD1 by forming the detour wiring, and as a result, the semiconductor device SD1 is reduced in size.

In the first embodiment, the second inductor device IND2 has a first portion P1, a second portion P2 and a connecting portion CP.

The first portion P1 is formed along the first inductor element IND1 in the same layer as the layer in which the first inductor element IND1 is formed. The first portion P1 is constituted by a third wiring M3.

The second portion P2 is, in plan view, formed such that the second portion P2 intersects the first inductor element IND1 in a layer that differs from the layer in which the first inductor element IND1 is formed. In the first embodiment, the second portion P2 is formed in the same layer as the fourth wiring M4 formed above the third wiring M3. The second portion P2 is constituted by a fourth wiring M4.

The connecting portion CP electrically connects the first portion P1 and the second portion P2 with each other. In the first embodiment, the connecting portion CP is formed by the fourth via V4.

Examples of the width and the thickness of the second inductor element IND2 is similar to the example of the width and the thickness of the first inductor element IND1.

The capacitor element CE1 is formed in the multilayer wiring layer MWL. The capacitor element CE1 is formed in the same layer as the interlayer insulating layer in which the first inductor element IND1 and the second inductor element IND2 are formed. The capacitor element CE1 is formed inside one or both of the first inductor element IND1 and the second inductor element IND2 in plan view. In the first embodiment, the capacitor element CE1 is formed inside the first inductor element IND1 and the second inductor element IND2 in plan view. That is, the capacitor element CE1 is formed such that the capacitor element CE1 is surrounded by both the first inductor element IND1 and the second inductor element IND2 in plan view.

The capacitor element CE1 may or may not overlap with the wiring electrically connected with the transistor Tr in plan view. The capacitor CE1 preferably overlaps with the wiring electrically connected with the transistor Tr in plan view. As a result, it is possible to suppress the increase in size of the semiconductor device SD1 by forming the detour wiring, and as a result, the semiconductor device SD1 is reduced in size.

A structure of the capacitor element CE1 is not particularly limited as long as the capacitor element CE1 can function as a capacitor. The capacitor element CE1 includes the first lower electrode LE1, the second lower electrode LE2, an insulating layer IL, and the upper electrode UE. The capacitor element CE1 includes a first capacitor element C1 and a second capacitor element C2.

The first lower electrode LE1 is a lower electrode of the first capacitor element C1. The first lower electrode LE1 is configured to be supplied with a grounding potential. That is, the first lower electrode LE1 is electrically connected with a grounding line (not shown). The first lower electrode LE1 is formed in the same layers as the third wiring M3 constituting the first inductor elements IND1. The first lower electrode LE1 is apart from the first inductor element IND1 and the second inductor element IND2 in plan view.

The shape of the first lower electrodes LE1 is not particularly limited. From a viewpoint of forming a large capacitor element CE1, it is preferable that an outer edge of the first lower electrode LE1 facing the first inductor element IND1 or the second inductor element IND2 is along the first inductor element IND1 or the second inductor element IND2. As a result, a capacitor element CE1 having a large capacitance can be formed in an area surrounded by the first inductor element IND1 or the second inductor element IND2.

It is preferable that the first lower electrode LE1 has a portion without overlapping with the upper electrode UE in plan view. Thus, the fourth via V4 reaching the first lower electrode LE1 can be formed. A potential can be supplied to the first lower electrode LE1 through the fourth via V4 reaching the first lower electrode LE1.

An example of the configuration of the first lower electrode LE1 is similar to the example of the configuration of the third wiring M3, for example. Specifically, the first lower electrode LE1 is, for example, stacked film in which a barrier film, a conductive film, and a barrier film are stacked in this order. Examples of material of the barrier film include titanium (Ti) and titanium nitride (TiN). Examples of the material of the conductive film include aluminum, copper and tungsten.

The second lower electrode LE2 is a lower electrode of the second capacitor element C2. The second lower electrode LE2 is electrically connected with the second inductor element IND2. The second lower electrode LE2 is formed in the same layer as the third wiring M3 constituting the second inductor element IND2. That is, the second lower electrode LE2 is formed in the same layer as the first lower electrode LE1. The second lower electrode LE2 is apart from the first lower electrode LE1, the first inductor element IND1, and the second inductor element IND2 in plan view. Examples of shapes and configurations of the second lower electrode LE2 are similar to those of the first lower electrode LE1.

The insulating layer IL electrically insulates the first lower electrode LE1 and the upper electrode UE, and the insulating layer IL electrically insulates the second lower electrode LE2 and the upper electrode UE. In the first embodiment, the insulating layer IL is a portion of the fourth interlayer insulating layer IIL41. The portion of the fourth interlayer insulating layer IIL41 is formed on the first lower electrodes LE1. Another portion of the fourth interlayer insulating layer IIL41 is formed on the second lower electrodes LE2.

The upper electrode UE is an upper electrode of the first capacitor element C1 and an upper electrode of the second capacitor element C2. The upper electrode UE is electrically connected with the first inductor element IND1. A portion of the upper electrode UE faces the first lower electrode LE1 with the portion of the fourth interlayer insulating layer IIL41 interposed therebetween. Another portion of the upper electrode UE is formed such that another portion faces the second lower electrode LE2 with another portion of the fourth interlayer insulating layer IIL41 interposed therebetween. The upper electrode UE is covered with the fourth interlayer insulating layer IIL41 and the fourth interlayer insulating layer IIL42. The material of the upper electrode UE has only to have conductivity, and is, for example, titanium (Ti), titanium nitride (TiN), or tungsten (W). The thickness of the upper electrode UE is, for example, about 500 nm.

The capacitor element CE1 according to first embodiment has a first capacitor element C1 and a second capacitor element C2. The first capacitor element C1 includes the first lower electrode LE1, the portion of the fourth interlayer insulating layer IIL41, and the portion of the upper electrode UE. The second capacitor C2 includes the second lower electrode LE2, the another portion of the fourth interlayer insulating layer IIL41, and the another portion of the upper electrode UE.

Figure 3:
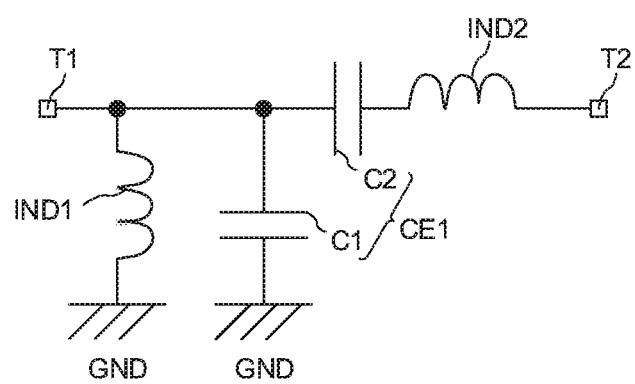
FIG. 3 is a circuit diagram illustrating an exemplary circuit composed of a first inductor element, a second inductor element, and a capacitor element according to the first embodiment.

FIG. 3 is a circuit diagram illustrating an exemplary circuit composed of the first inductor element IND1, the second inductor element IND2, and the capacitor element CE1 according to the first embodiment.

As shown in FIG. 3, in the first embodiment, the first inductor element IND1, the second inductor element IND2, and the capacitor element CE1 (the first capacitor element C1 and the second capacitor element C2) constitute band-pass filter circuits.

Specifically, the second inductor element IND2 and the second capacitor element C2 are coupled between the first terminal T1 and the second terminal T2. The first inductor IND1 is coupled between the first terminal T1 and the grounding line GND. The first capacitor element C1 is coupled between the first terminal T1 and the ground line GND. The first terminal T1 is commonly coupled to the first capacitor element C1, the second capacitor element C2, and the first inductor element IND1.

Here, one of the features of the semiconductor device SD1 according to first embodiment will be described. First, for comparison, a semiconductor device for comparison will be described. In the comparative semiconductor device, the capacitor element CE1 is formed in a layer different from the first inductor element IND1 and the second inductor element IND2.

As described above, in the comparative semiconductor device, the capacitor element CE1 is formed in a wiring layer differing from the first inductor element IND1 and the second inductor element IND2. For example, if the capacitor element CE1, the first inductor element IND1, and the second inductor element IND2 are formed in wiring layers differing from each other, at least three wiring resources are required. Specifically, the first inductor device IND1 is formed using the third wiring M3. The second inductor device IND2 is formed using a third wiring M3 and a fourth wiring M4. The capacitor element CE1 is formed using a wiring other than the third wiring M3 and the fourth wiring M4 among the multilayer wiring layer MWL. Therefore, in the above multilayer wiring layer, the wiring resources may be insufficient in a region where the capacitor element CE1, the first inductor element IND1, and the second inductor element IND2 are formed, as compared with other regions. As a result, for example, a wiring electrically connected with the transistor Tr may be formed to bypass the region. As a result, the comparative semiconductor device has a larger semiconductor device.

Further, in the comparative semiconductor device, it is assumed that the capacitor element CE1 is formed on the outer sides of the first inductor element IND1 and the second inductor element IND2 in plan view. In this instance, a size of the area occupied by the capacitor element CE1, the first inductor element IND1, and the second inductor element IND2 is increased by the size of the capacitor element CE1 in plan view. From this point of view, the semiconductor device of the comparative semiconductor device becomes large.

On the other hand, in the semiconductor device SD1 according to first embodiment, the capacitor element CE1 is formed in the same layers as the first inductor element IND1 and the second inductor element IND2. Thus, the capacitor element CE1, the first inductor element IND1, and the second inductor element IND2 may be configured with fewer wiring resources in the multilayer wiring layer MWL. In the first embodiment, the capacitor element CE1, the first inductor element IND1, and the second inductor element IND2 are formed using a third wiring M3 and a fourth wiring M4. This reduces the necessary to form a bypass wiring, as in the comparative semiconductor device. The capacitor element CE1 is formed inside the first inductor element IND1 and the second inductor element IND2 in plan view. Therefore, there is no need to provide spaces for forming the capacitor element CE1 on the outer sides of the first inductor element IND1 and the second inductor element IND2. As a result, according to the first embodiment, the semiconductor device SD1 can be reduced in size compared to the comparative semiconductor device.

(Method of Manufacturing Semiconductor Device)

Next, an exemplary method of manufacturing the semiconductor device SD1 according to the first embodiment will be described. FIGS. 4 to 12 are a cross-sectional view illustrating examples of steps included in the method of manufacturing the semiconductor device SD1.

The method of manufacturing the semiconductor device SD1 includes, for example, (1) step of providing a semiconductor wafer SW, (2) step of forming the semiconductor element SW, (3) step of forming the multilayer wiring layer MWL, the first inductor element IND1, the second inductor element IND2, and the capacitor element CE1.

(1) Providing of the Semiconductor Wafer SW

Figure 4:
FIG. 4 is a cross-sectional view illustrating an exemplary step included in a method of manufacturing the semiconductor device according to the first embodiment.

First, as shown in FIG. 4, the semiconductor wafer SW is provided. The semiconductor wafer SW may be purchased as a commercial product, for example. The semiconductor wafer SW includes a first surface (upper surface) SF1 and a second surface (lower surface) SF2 which are in a front-back relation to each other. Examples of semiconductor substrate SUB include silicone substrate.

(2) Forming Semiconductor Devices

Figure 5:
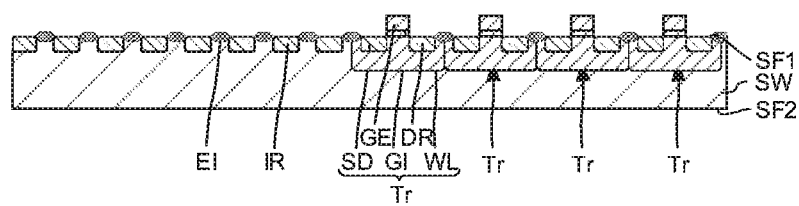
FIG. 5 is a cross-sectional view illustrating an exemplary step included in a method of manufacturing the semiconductor device according to the first embodiment.

Next, as shown in FIG. 5, impurity region IR, element isolation EI, and semiconductor elements are formed on the first surface SF1 of the semiconductor wafer SW. In first embodiment, transistor Tr is formed as semiconductor elements. As a method of forming the impurity region IR, the element isolation EI, and the transistor Tr, a method known in the art can be adopted.

(3) Forming of Multilayer Wiring Layer MWL, First Inductor Element IND1, Second Inductor Element IND2, and Capacitor Element CE1

Next, the multilayer wiring layer MWL, the first inductor element IND1, the second inductor element IND2, and the capacitor element CE1 are formed. As a method of forming the multilayer wiring layer MWL, a method known as a method of forming multilayer wiring layer in the semiconductor technology can be adopted.

Figure 6:
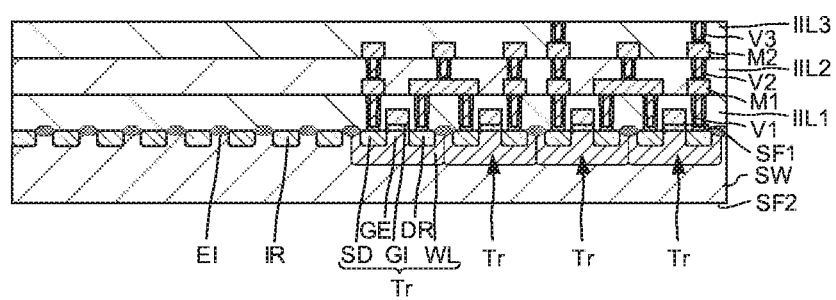
FIG. 6 is a cross-sectional view illustrating an exemplary step included in a method of manufacturing the semiconductor device according to the first embodiment.

First, as shown in FIG. 6, the first interlayer insulating layer IIL1, the first via V1, the first wiring M1, the second interlayer insulating layer IIL2, the second via V2, the second wiring M2, the third interlayer insulating layer IIL3, and the third via V3 are formed.

The first interlayer insulating layer IIL1, the second interlayer insulating layer IIL2, and the third interlayer insulating layer IIL3 are formed by, for example, a CVD method. The first via V1 is formed, for example, by forming a through hole in the first interlayer insulating layer IIL1 and then burying the through hole with a conductive material. The second via V2 is formed, for example, by forming a through hole in the second interlayer insulating layer IIL2 and then burying the through hole with a conductive material. The third via V3 and the connecting portion CP of the second inductor device IND2 are formed, for example, by forming a through hole in the third interlayer insulating layer IIL3 and then burying the through hole with a conductive material. The first wiring M1 and the second wiring M2 are formed by forming a conductive film by a sputtering method and then patterning the conductive film into a desired shape.

Figure 7:
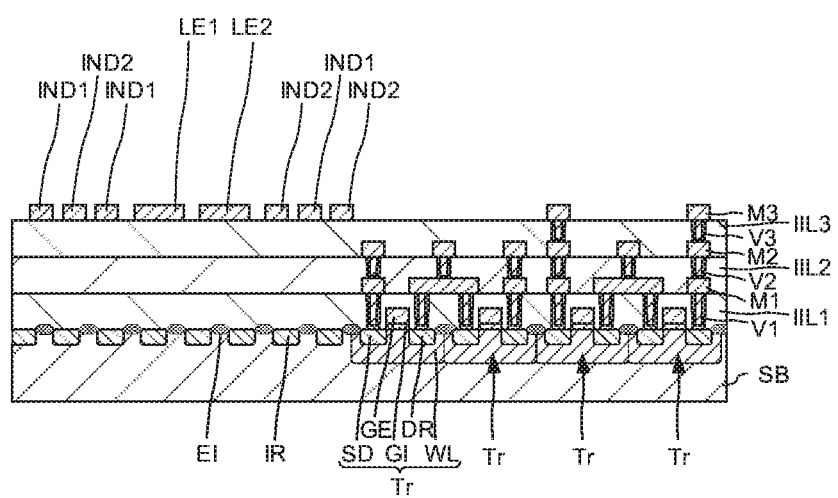
FIG. 7 is a cross-sectional view illustrating an exemplary step included in a method of manufacturing the semiconductor device according to the first embodiment.

Next, as shown in FIG. 7, the first inductor element IND1, the first portion P1 of the second inductor element IND2, the first lower electrode LE1 of the capacitor element CE1, and the second lower electrode LE2 of the capacitor element CE1 are formed on the third interlayer insulating layer IIL3. These elements are formed by forming a conductive film by a sputtering method and then patterning the conductive film into a desired shape.

Figure 8:
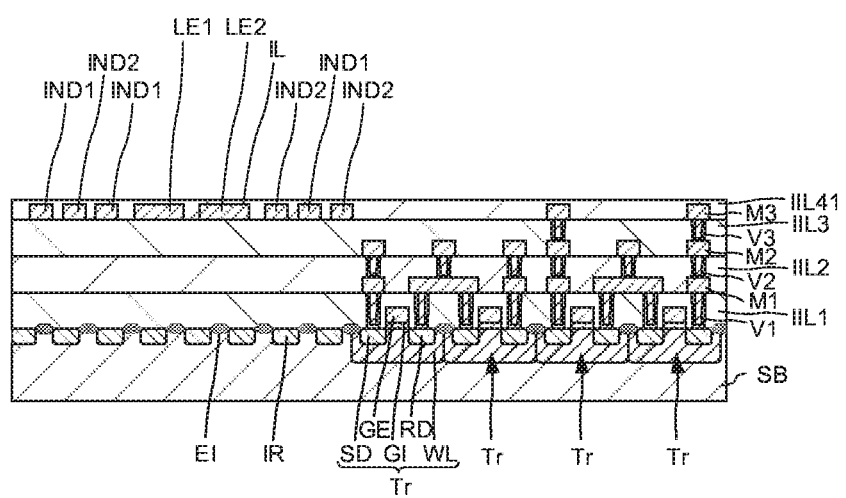
FIG. 8 is a cross-sectional view illustrating an exemplary step included in a method of manufacturing the semiconductor device according to the first embodiment.

Next, as shown in FIG. 8, the fourth interlayer insulating layer IIL41 is formed on the third interlayer insulating layer IIL3. The fourth interlayer insulating layer IIL41 is formed by, for example, CVD method. In this instance, the fourth interlayer insulating layer IIL41 is formed so as to bury a region between the first lower electrode LE1 and the second lower electrode LE2. The upper surface of the fourth interlayer insulating layer IIL41 is preferably planarized. Thus, the thickness of the portion of the fourth interlayer insulating layer IIL41 located on the first lower electrode LE1 and the thickness of the portion of the fourth interlayer insulating layer IIL41 located on the second lower electrode LE2 can be adjusted to a desired thickness. As a result, the capacitance of the capacitor element CE1 is adjusted. A method of planarizing the fourth interlayer insulating layer IIL41 is, for example, CMP method.

Figure 9:
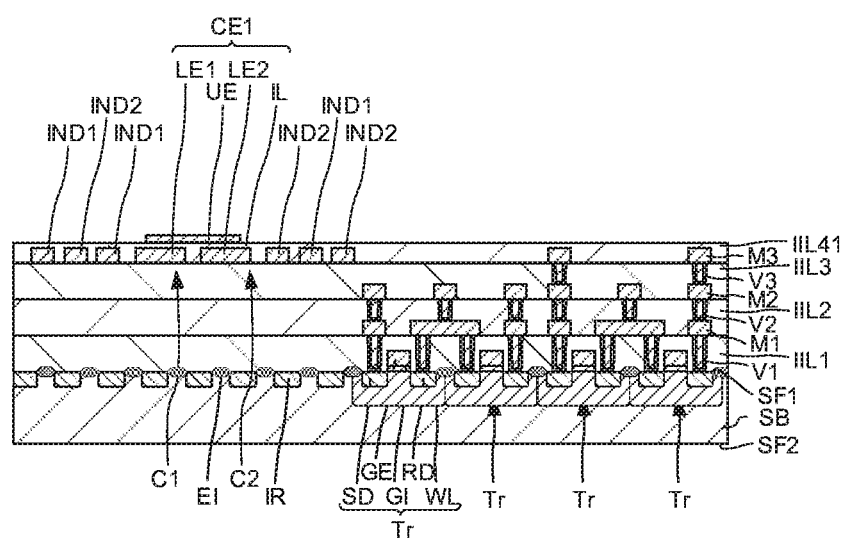
FIG. 9 is a cross-sectional view illustrating an exemplary step included in a method of manufacturing the semiconductor device according to the first embodiment.

Next, as shown in FIG. 9, the upper electrodes UE of the capacitor element CE1 is formed on the fourth interlayer insulating layer IIL41. The upper electrode UE is formed by forming a conductive film by a sputtering method and then patterning the conductive film into a desired shape. The upper electrode UE is formed so as to face the first lower electrode LE1 and the second lower electrode LE2 with the fourth interlayer insulating layer IIL41 interposed therebetween.

Figure 10:
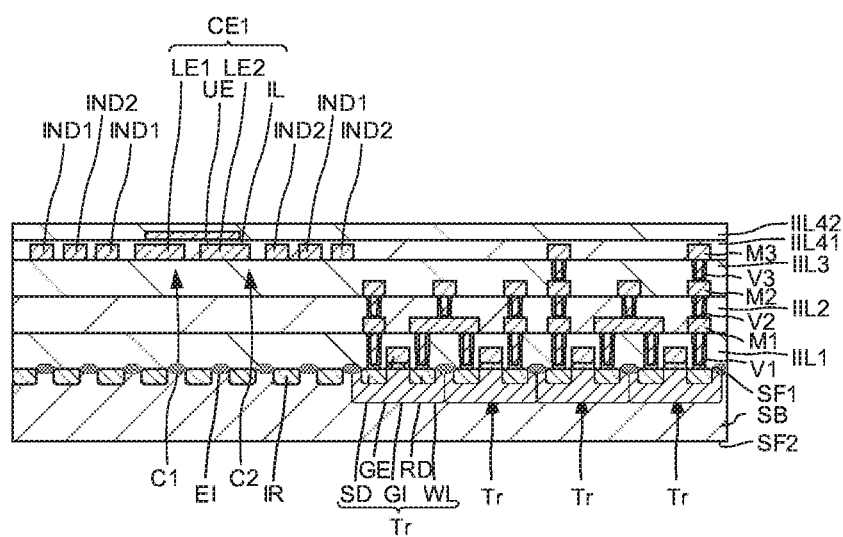
FIG. 10 is a cross-sectional view illustrating an exemplary step included in a method of manufacturing the semiconductor device according to the first embodiment.

Next, as shown in FIG. 10, a fourth interlayer insulating layer IIL42 is formed on the fourth interlayer insulating layer IIL41 so as to cover the upper electrodes UE. The fourth interlayer insulating layer IIL42 is formed by, for example, CVD method.

Figure 11:
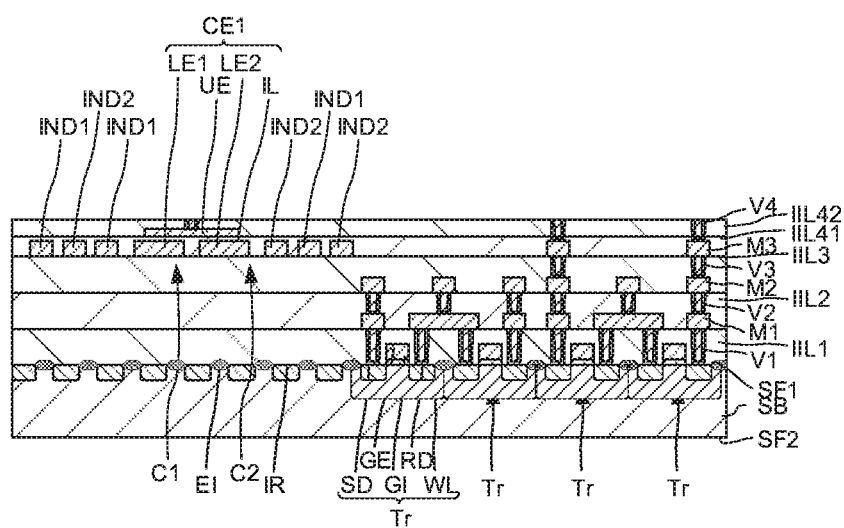
FIG. 11 is a cross-sectional view illustrating an exemplary step included in a method of manufacturing the semiconductor device according to the first embodiment.

Next, as shown in FIG. 11, the fourth via V4 and the connecting portion CP (not shown in FIG. 11) are formed in one or both of the fourth interlayer insulating layer IIL41 and the fourth interlayer insulating layer IIL42. More specifically, the fourth via V4 reaching the third wiring M3 is formed so as to penetrate the fourth interlayer insulating layer IIL41 and the fourth interlayer insulating layer IIL42. The fourth via V4 reaching the first portion P1 of the second inductor device IND2 is formed so as to penetrate the fourth interlayer insulating layer IIL41 and the fourth interlayer insulating layer IIL42. Further, the fourth via V4 reaching the upper electrode UE is formed so as to penetrate the fourth interlayer insulating layer IIL42. That is, the fourth via V4 reaching the upper electrode UE does not penetrate the fourth interlayer insulating layer IIL41.

Figure 12:
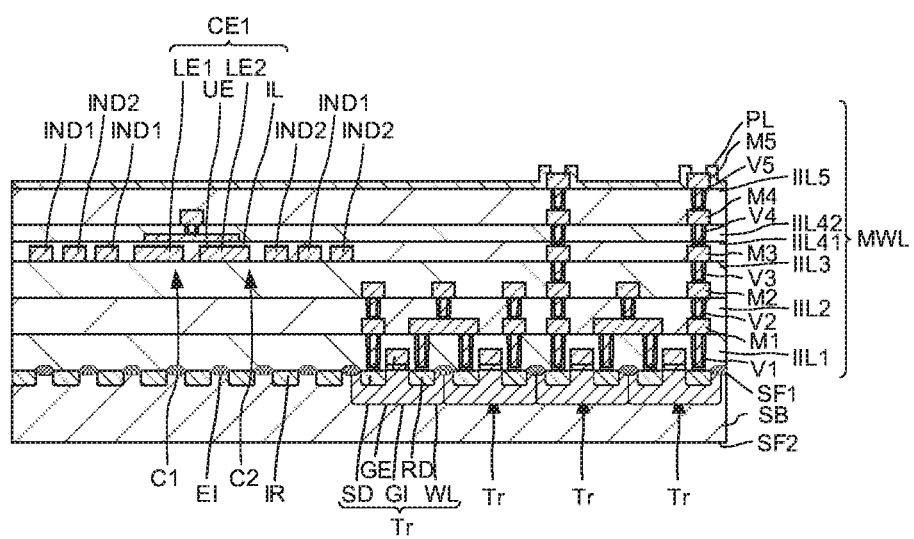
FIG. 12 is a cross-sectional view illustrating an exemplary step included in a method of manufacturing the semiconductor device according to the first embodiment.

Next, as shown in FIG. 12, the fourth wiring M4, the second portion P2 of the second inductor device IND2 (not shown in FIG. 12), the fifth interlayer insulating layer IIL5, the fifth via V5, the fifth wiring M 5, and the protective layer PL are formed.

The fifth interlayer insulating layer IIL5 and the protective layer PL are formed by, for example, CVD method. The fifth via V5 is formed, for example, by forming a through hole in the fifth interlayer insulating layer IIL5 and then burying the through hole with a conductive material. The fourth wiring M4, the fifth wiring M5, and the second portion P2 of the second inductor device IND2 are formed by forming a conductive film by sputtering method and then patterning the conductive film into a desired shape.

Finally, by dicing the structures obtained by the above steps, a plurality of singulated semiconductor devices SD1 are obtained.

(Effect)

In the semiconductor device SD1 according to the first embodiment, the capacitor element CE1 is formed in the same layers as the first inductor element IND1 and the second inductor element IND2. The entire capacitor element CE1 is formed inside the first inductor element IND1 and the second inductor element IND2 in plan view. As a result, the semiconductor device SD1 can be reduced in size as compared with the first case in which the capacitor element CE1 is formed on the outer side of the first inductor element IND1 and the second inductor element IND2 in plan view. Further, the semiconductor device SD1 can be reduced in size compared to the second embodiment in which the capacitor element CE1 is formed in a layer different from the layer of the first inductor element IND1 and the layer of the second inductor element IND2.

[First Modification]

Figure 13:
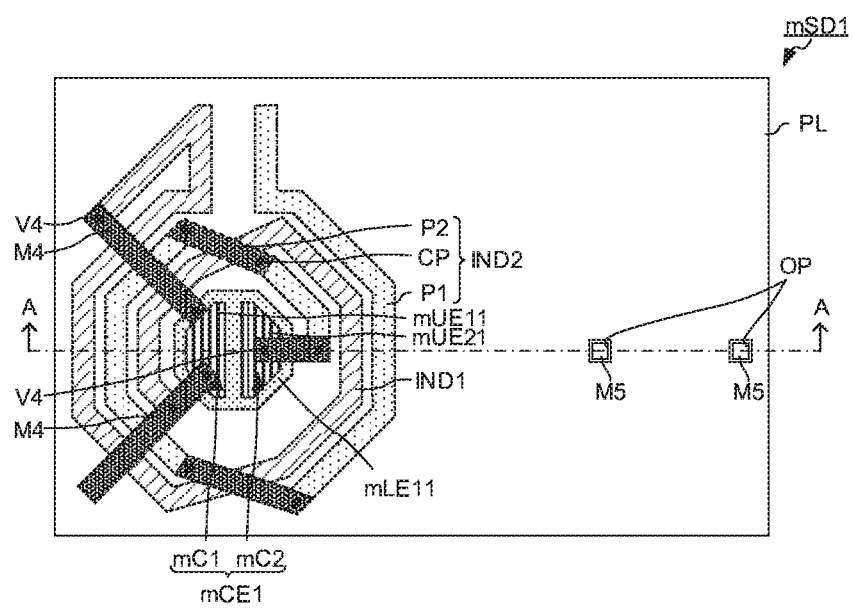
FIG. 13 is a plan view illustrating an exemplary configuration of a main portion of the semiconductor device according to a first modification of the first embodiment.
Figure 14:
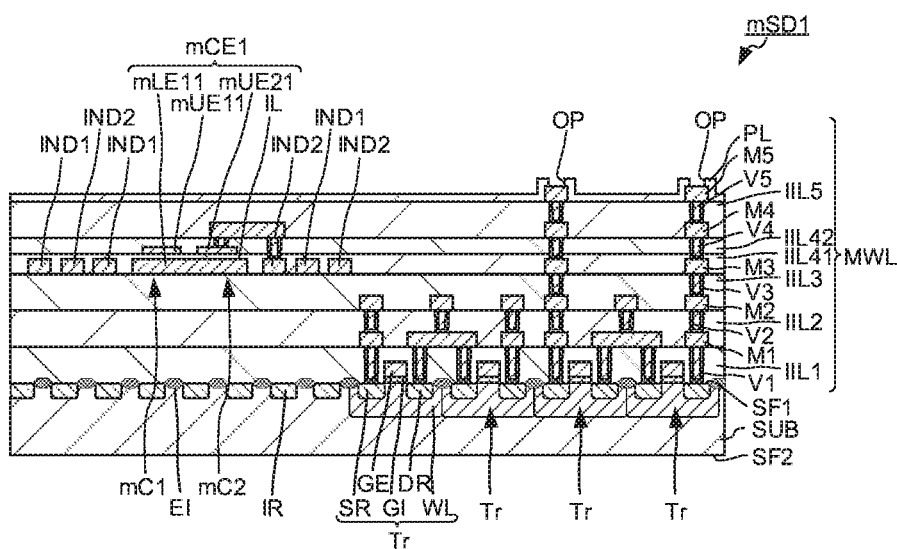
FIG. 14 is a cross-sectional view illustrating an exemplary configuration of the main portion of the semiconductor device according to the first modification of the first embodiment.

FIG. 13 is a plan view illustrating an exemplary configuration of a main portion of a semiconductor device mSD1 according to the first modification of the first embodiment. FIG. 14 is a cross-sectional view illustrating an exemplary configuration of a main portion of a semiconductor device mSD1 according to the first modification of the first embodiment. FIG. 14 is a cross-sectional view taken along line A-A in FIG. 13.

As shown in FIGS. 13 and 14, in the semiconductor device mSD1, the capacitor element mCE1 includes a lower electrode mLE11, the insulating layer IL, a first upper electrode mUE11, and a second upper electrode mUE21. The insulating layer IL is a portion of the fourth interlayer insulating layer IIL41.

The capacitor element mCE1 includes a first capacitor element mC1 and a second capacitor element mC2. The first capacitor element mC1 includes a portion of the lower electrode mLE11, a portion of the fourth interlayer insulating layer IIL41, and the first upper electrode mUE11. The second capacitor mC2 includes another portion of the lower electrode mLE11, another portion of the fourth interlayer insulating layer IIL41, and the second upper electrode mUE21. The first upper electrode mUE11 and the second upper electrode mUE21 may be formed so as to face one lower electrode mLE11 as in the capacitor element mCE1 according to the first modification.

In the first modification, the lower electrode mLE11 is electrically connected to the first inductor element IND1. The second upper electrode mUE21 is electrically connected to the second inductor element IND2.

[Second Modification]

Figure 15:
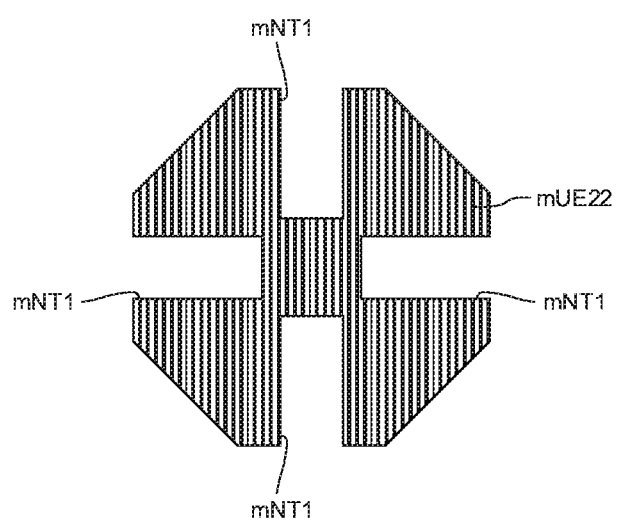
FIG. 15 is a plan view illustrating an upper electrode according to a second modification of the first embodiment.
Figure 16:
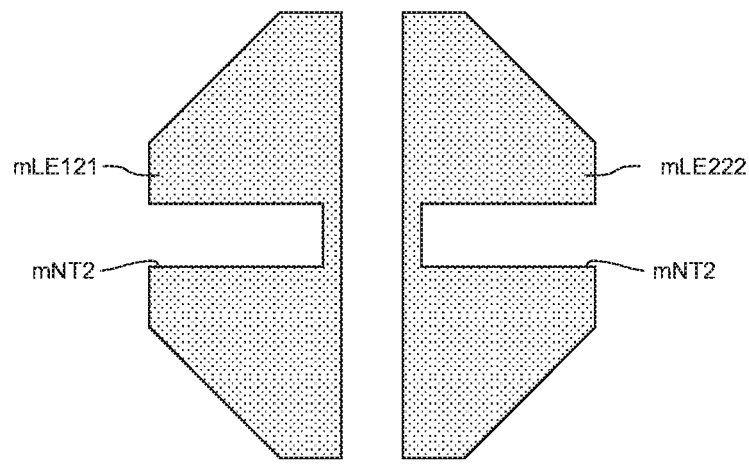
FIG. 16 is a plan view illustrating a first lower electrode and a second lower electrode according to the second modification of the first embodiment.

FIG. 15 is a plan view of an upper electrode mUE22 according to the second modification of the first embodiment. FIG. 16 is a plan view of a first lower electrode mLE121 and a second lower electrode mLE222 according to the second modification of the first embodiment.

As shown in FIG. 15, notches mNT1 are formed in the upper electrodes mUE22. The number of the first notch mNT1 is not particularly limited, but in second modification, the number of the first notch mNT1 is four. The first notch mNT1 extends toward the center of the area surrounded by the first inductor element IND1 and the second inductor element IND2 in plan view. In the second modification, the first notch mNT1 extends from the outer edge of the upper electrode UE toward the center of the upper electrode UE in plan view.

As shown in FIG. 16, second notches mNT2 are formed in the first lower electrode mLE121 and the second lower electrode mLE222, respectively. The number of the second notch mNT2 is not particularly limited, but in second modification, the number of the second notch mNT2 is two. The two notches mNT2 are formed in the first lower electrode mLE121 and the second lower electrode mLE222, respectively. The notch mNT2 extends toward the center of the area surrounded by the first inductor element IND1 and the second inductor element IND2 in plan view.

In the second modification, since the first notch mNT1 and the second notch mNT2 are formed, the generation of eddy current in the first lower electrode mLE121, the second lower electrode mLE222, and the upper electrode mUE22 due to the magnetic fields caused by the first inductor element IND1 and the second inductor element IND2 is suppressed. As a result, it is possible to suppress the current in the first inductor element IND1 and the second inductor element IND2 from being reduced by the magnetic field caused by the eddy current.

The notch may not be formed in all of the first lower electrode mLE121, the second lower electrode mLE222, and the upper electrode mUE22. The notch may be formed in at least one of the first lower electrode mLE121, the second lower electrode mLE222, and the upper electrode mUE22.

[Third Modification]

Figure 17:
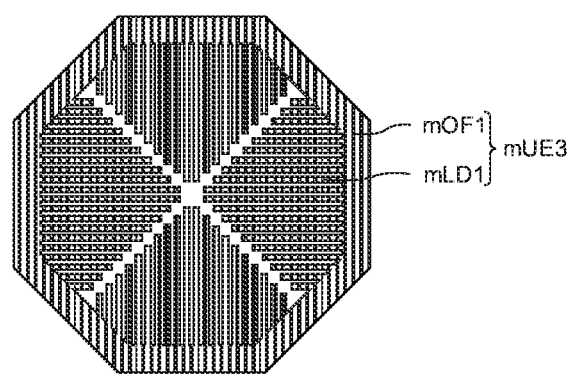
FIG. 17 is a plan view illustrating an upper electrode according to a third modification of the first embodiment.
Figure 18:
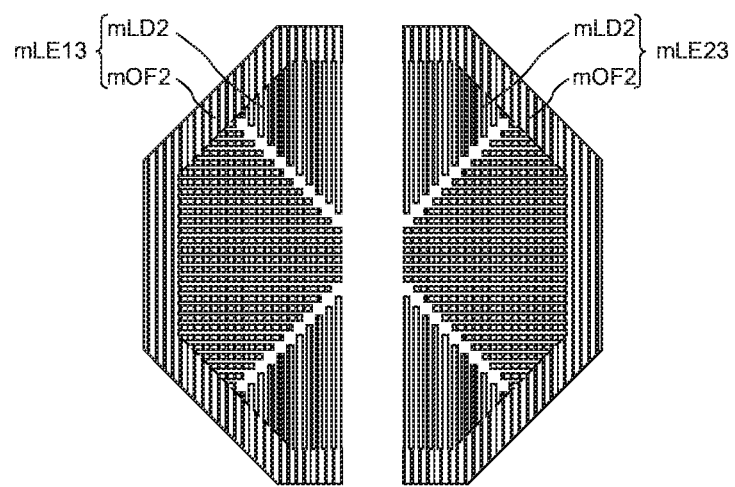
FIG. 18 is a plan view illustrating a first lower electrode and a second lower electrode according to the third modification of the first embodiment.

FIG. 17 is a plan view of an upper electrode mUE3 according to the third modification of the first embodiment. FIG. 18 is a plan view of the first lower electrode mLE13 and the second lower electrode mLE23 according to the third modification of the first embodiment.

As shown in FIG. 17, the upper electrode mUE3 includes a first outer frame portion mOF1 and a plurality of first rod portions mLD1. One end of each of the plurality of first rod portions mLD1 is connected to the first outer frame portion mOF1. The plurality of first rod portions mLD1 extend toward the center of the region surrounded by the first inductor element IND1 and the second inductor element IND2 in the region surrounded by the first outer edge portion mOF1. The plurality of first rod portions mLD1 are apart from each other.

As shown in FIG. 18, each of the first lower electrode mLE13 and the second lower electrode mLE23 includes a second outer frame portion mOF2 and a plurality of second rod portions mLD2. One end of each of the plurality of second rod portions mLD2 is connected to the second outer frame portion mOF2. The plurality of second rod portions mLD2 extend toward the center of the region surrounded by the first inductor element IND1 and the second inductor element IND2 in the region surrounded by the second outer edge portion mOF2. The plurality of second rod portions mLD2 are apart from each other.

Also in third modification, similarly to second modification, the generation of eddy current in the first lower electrode mLE13, the second lower electrode mLE23, and the upper electrode mUE3 is suppressed.

[Fourth Modification]

Figure 19:
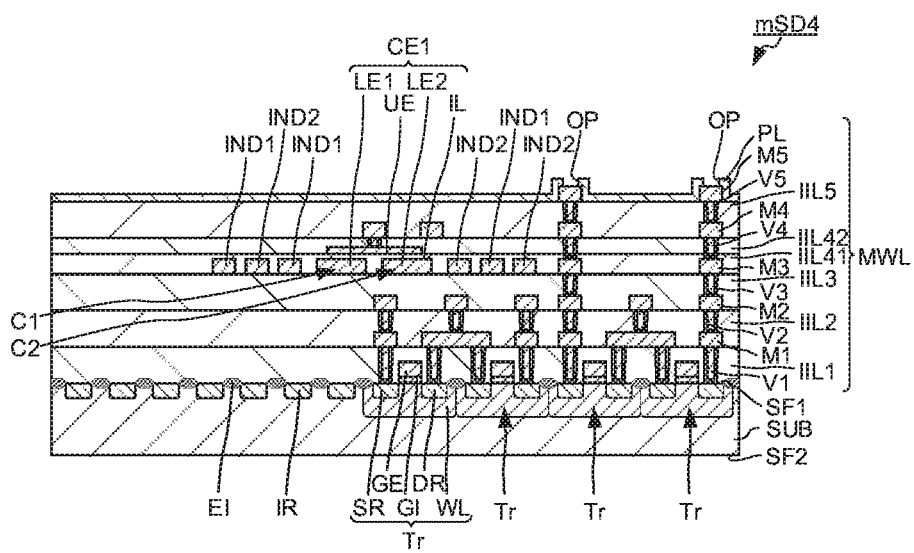
FIG. 19 is a cross-sectional view illustrating an exemplary configuration of a main portion of a semiconductor device according to a fourth modification of the first embodiment.

FIG. 19 is a cross-sectional view illustrating an exemplary configuration of a main portion of a semiconductor device mSD4 according to a fourth modification of first embodiment.

As shown in FIG. 19, in fourth modification, the region surrounded by the first inductor element IND1 overlaps with the transistor Tr in plan view. The region surrounded by the second inductor element IND2 also overlaps with the transistor Tr in plan view. Further, the capacitor element CE1 also overlaps with the transistor Tr in plan view. As a result, according to the fourth modification, the semiconductor device mSD4 can be made smaller.

Second Embodiment

A semiconductor device according to a second embodiment has low-pass filter circuit.

The semiconductor device SD2 according to the second embodiment differs from the semiconductor device SD1 according to the first embodiment only in the circuitry configuration. Therefore, the same elements as those of the semiconductor device SD 1 according to the first embodiment are denoted by the same reference numerals, and descriptions thereof are omitted.

(Configuration of Semiconductor Device)

Figure 20:
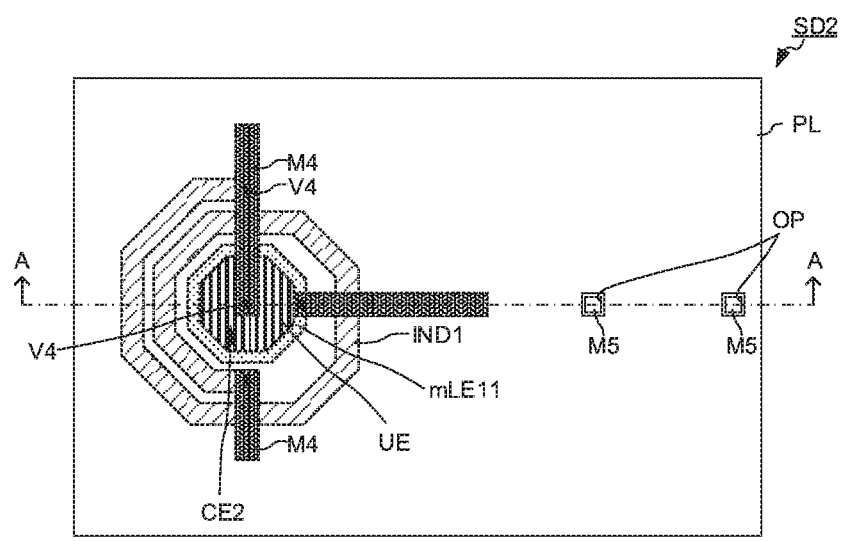
FIG. 20 is a plan view illustrating an exemplary configuration of a main portion of the semiconductor device according to a second embodiment.
Figure 21:
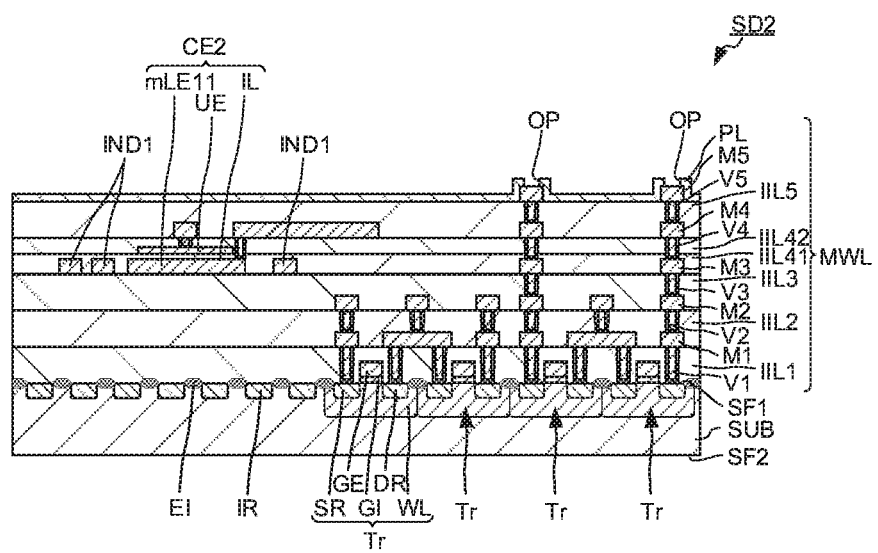
FIG. 21 is a cross-sectional view illustrating an exemplary configuration of the main portion of the semiconductor device according to the second embodiment.
Figure 22:
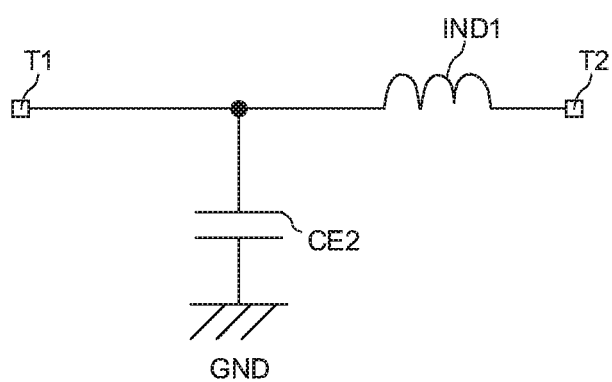
FIG. 22 is a circuit diagram illustrating an exemplary circuit composed of a first inductor element and a capacitor element according to the second embodiment.

FIG. 20 is a plan view illustrating an exemplary configuration of a main portion of a semiconductor device SD2 according to the second embodiment. FIG. 21 is a cross-sectional view illustrating an exemplary configuration of the main portion of the semiconductor device SD2. FIG. 21 is a cross-sectional view taken along line A-A of FIG. 20. FIG. 22 is a circuit diagram illustrating an exemplary circuit constituted by the first inductor element IND1 and the capacitor element CE2 according to the second embodiment.

The semiconductor device SD includes a semiconductor substrate SUB, a multilayer wiring layer MWL, a first inductor element IND1, and a capacitor element CE2. The capacitor element CE2 includes a first lower electrode mLE11, a portion of a fourth interlayer insulating layer IIL41, and an upper electrode UE.

In the second embodiment, the first inductor element IND1 and the capacitor element CE2 constitute a low-pass filter.

Specifically, the first inductor device IND1 is coupled between the first terminal T1 and the second terminal T2. The capacitor element CE2 is coupled between the first terminal T1 and the grounding line GND. The first terminal T1 is commonly coupled to the capacitor element CE2 and the first inductor element IND1. The first terminal T1 and the second terminal T2 are internal terminals configured to be coupled to other semiconductor elements in the semiconductor device SD2.

(Effect)

The semiconductor device SD2 according to the second embodiment has similar to effect as the semiconductor device SD1 according to the first embodiment.

Third Embodiment

A semiconductor device according to a third embodiment includes a high-pass filter.

The semiconductor device SD3 according to the third embodiment differs from the semiconductor device SD2 according to the second embodiment only in the circuitry configuration. The semiconductor device SD3 differs from the semiconductor device SD2 only in the connectivity between the elements. Therefore, the same elements as those of the semiconductor device SD2 according to the second embodiment are denoted by the same reference numerals, and descriptions thereof are omitted.

(Configuration of Semiconductor Device)

Figure 23:
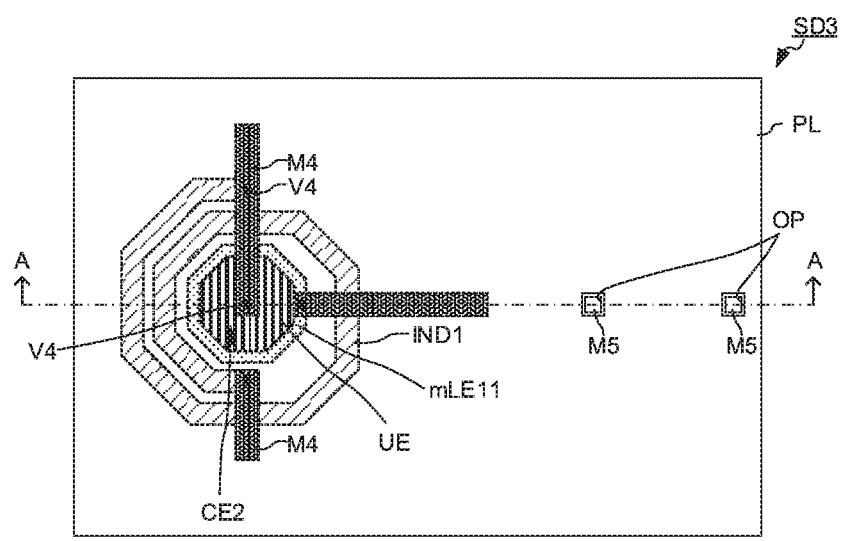
FIG. 23 is a plan view illustrating an exemplary configuration of a main portion of the semiconductor device according to a third embodiment.
Figure 24:
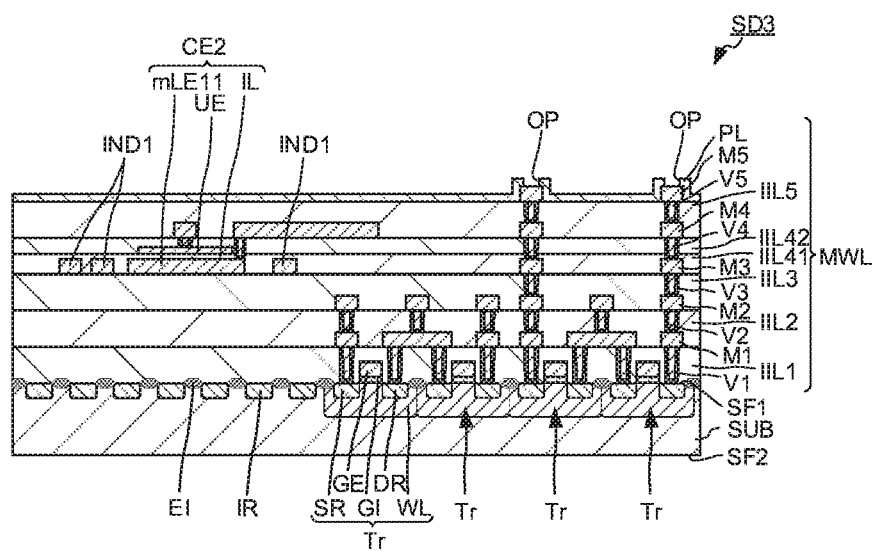
FIG. 24 is a cross-sectional view illustrating an exemplary configuration of the main portion of the semiconductor device according to the third embodiment.
Figure 25:
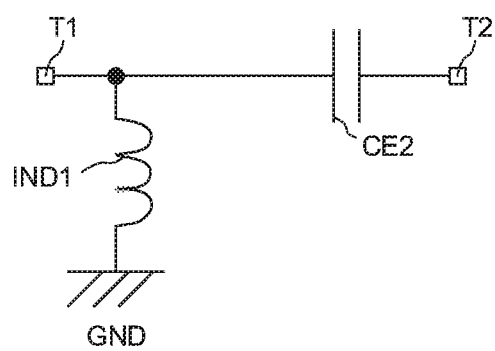
FIG. 25 is a circuit diagram illustrating an exemplary circuit composed of a first inductor element and a capacitor element according to the third embodiment.

FIG. 23 is a plan view illustrating an exemplary configuration of a main portion of the semiconductor device SD3 according to the third embodiment. FIG. 24 is a cross-sectional view illustrating an exemplary configuration of the main portion of the semiconductor device SD3. FIG. 24 is a cross-sectional view taken along line A-A of FIG. 23. FIG. 25 is a circuit diagram illustrating an exemplary circuit constituted by the first inductor element IND1 and the capacitor element CE2 according to the third embodiment.

The semiconductor device SD3 includes a semiconductor substrate SUB, a multilayer wiring layer MWL, a first inductor element IND1, and a capacitor element CE2.

In the third embodiment, the first inductor element IND1 and the circuit element CE2 (a first capacitor element C1), constitute a high-pass filter.

Specifically, the capacitor element CE2 is coupled between the first terminal T1 and the second terminal T2. The first inductor IND1 is coupled between the first terminal T1 and the grounding line GND. The first terminal T1 is commonly coupled to the capacitor element CE2 and the first inductor element IND1.

(Effect)

The semiconductor device SD3 according to the third embodiment has similar to effect as the semiconductor device SD1 according to the first embodiment.

It should be noted that the present invention is not limited to the above-mentioned embodiments, and various modifications can be made without departing from the gist thereof. For example, multilayer wiring layer MWL may further include other layers between layers. Examples of the other layers include, for example, a silicon nitride film. The wiring of the multilayer wiring layer MWL may have a so-called damascene structure.

In the multilayer wiring layer MWL, the positions where the first inductor element IND1, the second inductor element IND2, and the capacitor elements CE1, CE2 are formed are not particularly limited.

In the multilayer wiring layer MWL, the first inductor element IND1 and the second inductor element IND2 may be formed in wiring layers that differ from each other.

The semiconductor device may further include a capacitor element formed on the outer side of the first inductor element IND1 and the second inductor element IND2 in plan view.

In the capacitor element CE1 according to the first embodiment, the upper electrode of the first capacitor element C1 and the upper electrode of the second capacitor element C2 are formed as single member with each other. However, the upper electrode of the first capacitor element C1 and the upper electrode of the second capacitor element C2 may be configured separately from each other. The lower electrode of the first capacitor element C1 and the lower electrode of the second capacitor element C2 may be formed as single member with each other.

In the above embodiments, the semiconductor device includes a band-pass filter circuit, a low-pass filter circuit, or a high-pass filter circuit has been described, but the semiconductor device may include other circuit including an inductor element and a capacitor element.

Further, at least a part of each embodiment and each modification may be arbitrarily combined with each other. For example, the shapes, positions, numbers, and the like of the first inductor element IND1, the second inductor element IND2, and the capacitor elements CE1, CE2 may be appropriately changed based on each embodiment and each modification. For example, the first inductor element IND1, the second inductor element IND2, and the capacitor elements CE1, CE2 may be formed in any of the interlayer insulating layers IIL2 to the fifth interlayer insulating layer IIL5 in the multilayer wiring layer MWL.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

What is claimed is:

1. A semiconductor device comprising:
   a semiconductor substrate;
   a multilayer wiring layer formed on the semiconductor substrate;
   a first inductor element formed in the multilayer wiring layer; and
   a first capacitor element having a portion formed in layer in which the first inductor element is formed in the multilayer wiring layer,
   wherein the first capacitor element is formed inside the first inductor element in plan view.

2. The semiconductor device according to claim 1, wherein the first inductor element and the first capacitor element constitute a band-pass filter circuit, a low-pass filter circuit or a high-pass filter circuit.

3. The semiconductor device according to claim 1, comprising:
   a second inductor element formed in the multilayer wiring layer; and
   a second capacitor element having a portion formed in a layer in which the second inductor element is formed in the multilayer wiring layer,
   wherein the second capacitor element is formed inside the second inductor element in plan view.

4. The semiconductor device according to claim 3,
   wherein the first inductor element has a spiral shape in plan view, and
   wherein the second inductor element comprises:
   a first portion formed in the layer in which the first inductor element is formed such that the first portion extends along the first inductor element;
   a second portion formed in a layer different from the layer in which the first inductor element is formed such that the second portion intersects with the first inductor element in plan view; and
   a connecting portion electrically connecting the first portion and the second portion with each other.

5. The semiconductor device according to claim 1,
   wherein the first capacitor element comprises:
   a first lower electrode formed in the layer in which the first inductor element is formed;
   a portion of an insulating layer formed on the first lower electrode; and
   a first upper electrode facing the first lower electrode with the portion of an insulating layer interposed between the first upper electrode and the first lower electrode, and
   wherein the insulating layer covers the first inductor element.

6. The semiconductor device according to claim 3,
   wherein the first capacitor element comprises:
   a first lower electrode formed in the layer in which the first inductor element is formed;
   a portion of an insulating layer formed on the first lower electrode; and
   a first upper electrode facing the first lower electrode with the portion of an insulating layer interposed between the first upper electrode and the first lower electrode,
   wherein the second capacitor element comprises:
   a second lower electrode formed in the layer in which the second inductor element is formed;
   another portion of the insulating layer formed on the second lower electrode; and
   a second upper electrode facing the second lower electrode with the insulating layer interposed between the second upper electrode and the second lower electrode, and
   wherein the insulating layer covers the first inductor element and the second inductor element.

7. The semiconductor device according to claim 1, comprising a semiconductor element formed on a main surface of the semiconductor substrate,
   wherein a region surrounded by the first inductor element overlaps with the semiconductor element.

8. The semiconductor device according to claim 7, wherein the first capacitor element overlaps with the semiconductor element in plan view.

9. The semiconductor device according to claim 7, wherein the semiconductor element is a transistor.

10. The semiconductor device according to claim 8, wherein the semiconductor element is a transistor.

11. The semiconductor device according to claim 3, comprising a semiconductor element formed on a main surface of the semiconductor substrate, wherein a region surrounded by one or both of the first inductor element and the second inductor element overlap with the semiconductor element in plan view.

12. The semiconductor device according to claim 11, wherein one or both of the first capacitor element and the second capacitor element overlap with the semiconductor element in plan view.

13. The semiconductor device according to claim 11, wherein the first capacitor element overlaps with the semiconductor element in plan view.

14. The semiconductor device according to claim 12, wherein the semiconductor element is a transistor.

15. The semiconductor device according to claim 5,
wherein a material of the first inductor element is aluminum or copper,
wherein a material of the first lower electrode is aluminum or copper, and
wherein a material of the first upper electrode is titanium, titanium nitride, or tungsten.

16. The semiconductor device according to claim 6,
wherein a material of the first inductor element is aluminum or copper,
wherein a material of the second inductor element is aluminum or copper,
wherein a material of the first lower electrode is aluminum or copper,
wherein a material of the second lower electrode is aluminum or copper,
wherein a material of the first upper electrode is titanium, titanium nitride, or tungsten, and
wherein a material of the second upper electrode is titanium, titanium nitride, or tungsten.

* * * * *